United States Patent [19]

Minnick et al.

[11] 3,973,248
[45] Aug. 3, 1976

[54] NON-CONSERVATIVE BUBBLE LOGIC CIRCUITS

[76] Inventors: Robert C. Minnick, P.O. Box 1892, Houston, Tex. 77001; Paul T. Bailey, 700 Rugby Court, Creve Coeur, Mo. 63141; Robert M. Sandfort, 831 Tilbury Lane, St. Charles, Mo. 63301; Warren L. Semon, 12 Pebble Hill Road, DeWitt, N.Y. 13214

[22] Filed: Sept. 20, 1974

[21] Appl. No.: 507,700

Related U.S. Application Data

[62] Division of Ser. No. 311,402, Dec. 1, 1972, Pat. No. 3,866,191.

[52] U.S. Cl. .................... 340/174 TF; 307/88 LC; 340/347 DD
[51] Int. Cl.² .................................... G11C 11/14
[58] Field of Search ............... 340/174 TF, 174 SR, 340/347 DD; 307/88 LC

[56] References Cited
UNITED STATES PATENTS

| | | | |
|---|---|---|---|
| 3,638,208 | 1/1972 | Chow | 340/174 TF |
| 3,723,716 | 3/1973 | Bobeck et al. | 340/174 TF |
| 3,743,851 | 7/1973 | Kohara | 340/174 TF |
| 3,753,253 | 8/1973 | Smith | 340/174 TF |
| 3,770,978 | 11/1973 | Kluge | 340/174 TF |
| 3,811,110 | 5/1974 | Inose et al. | 340/174 TF |
| 3,821,725 | 6/1974 | Kita et al. | 340/174 TF |
| 3,824,567 | 7/1974 | Sakalay | 340/174 TF |
| 3,831,152 | 8/1974 | Perneski et al. | 340/174 TF |

OTHER PUBLICATIONS

IBM Tech. Disc. Bull., "Multiple Input Magnetic Bubble AND Gate," by Sakalay, vol. 14, No. 12, May 1972, pp. 3691, 3692.

*Primary Examiner*—James W. Moffitt
*Attorney, Agent, or Firm*—Lane, Aitken, Dunner & Ziems

[57] ABSTRACT

Magnetic bubble logic circuits performing the functions of various forms of flip-flops and decoders are presented. Set-reset and trigger flip-flops are constructed from specialized 3—3 conservative bubble logic circuits. Two forms of tree-type decoders employing crossovers of bubble tracks are illustrated for generating all possible product permutations of a plurality of input variables. Planar decoders and cross point circuits without crossovers are combined in matrix form to provide a multi-variable decoder without internal crossovers.

13 Claims, 7 Drawing Figures

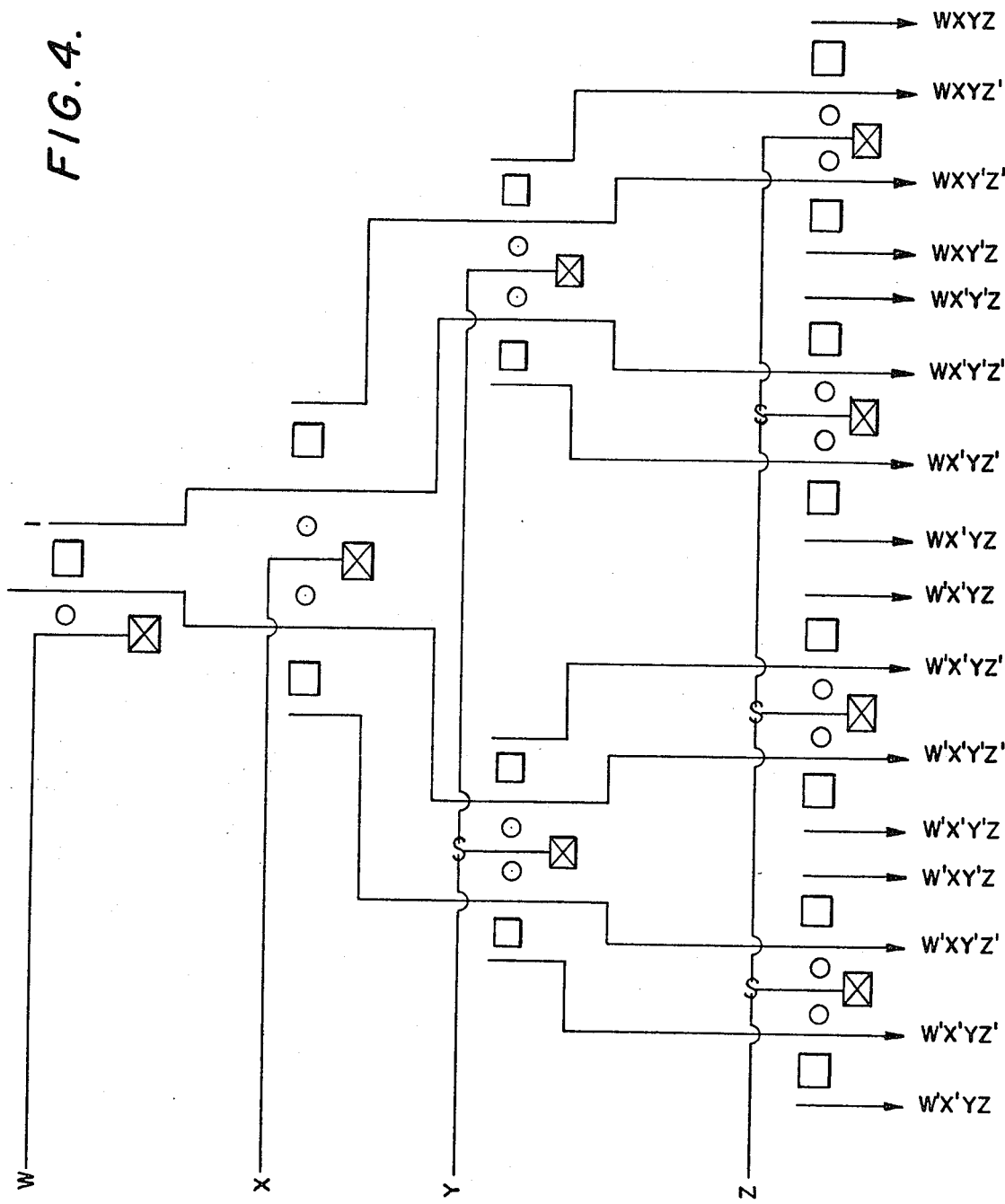

NON-CONSERVATIVE BUBBLE LOGIC CIRCUITS

This is a division of application Ser. No. 311,402 filed Dec. 1, 1972 and now U.S. Pat. No. 3,866,191.

BACKGROUND OF THE INVENTION

The invention relates generally to the field of magnetic bubble technology (MBT) and more particularly to logic arrangements utilizing the capabilities of single wall magnetic domain devices.

The continuing evolution of MBT has now reached the point where large scale application to various data processing tasks is practicable. Current interest in MBT is due primarily to the prospect of extremely high bit-packing density, low power consumption and reliability for low cost mass memories. Briefly, MBT involves the creation and propagation of single wall magnetic domains in specially prepared magnetic materials. The application of a static uniform magnetic bias field orthogonal to a sheet of magnetic material having suitable uniaxial anisotropy causes the normally serpentine pattern of magnetic domains to shrink into short cylindrical configurations called bubbles whose common polarity is opposite that of the bias field. The bubbles repel each other and can be moved or propagated by a magnetic field in the plane of the sheet.

Many schemes now exist for propagating bubbles along predetermined channels. One propagation system includes permalloy circuit elements shaped like military service stripes or "chevrons" spaced end-to-end in a thin layer over a sheet of magnetic material. The drive or propagation field is continuously rotating in the plane of the sheet causing each chevron to act as a small magnet whose poles are constantly changing. As the drive field rotates, a bubble under one of the chevrons is moved along the chevron channel from point to point in accordance with its magnetic attraction to the nearest attracting temporary pole of the circuit elements. This system is among those referred to as "field-access" as distinguished from other systems employing loops of conductors disposed over a magnetic sheet.

The use of MBT in data processing stems from the fact that the bubbles can be propagated through their channels at a precisely determined rate so that uniform data streams of bubbles are possible in which the presence or absence of a bubble indicates a binary 1 or 0. The use of MBT for performing logic operations is based on the fact that close magnetic bubbles tend to repel each other. Thus, if alternate paths with varying degrees of preference are built into the chevron circuit, the direction which a bubble on one channel ultimately takes may be influenced by the presence or absence of a bubble on another closely spaced channel.

Besides the inherent capability of performing logic with magnetic domains, one other aspect of MBT has given impetus to logic development. MBT was originally envisioned as a mass memory, but the most difficult problem has been encountered in readout. Optional devices utilizing the Faraday effect and magnetoresistive devices have been used, but are not entirely satisfactory. Therefore, it is important to minimize readout to the extent possible by incorporating logic in the memory so that the magnetic bubbles representing information can be logically manipulated before readout is necessary, thus increasing the quality or informational content of each bit of readout.

In the copending U.S. patent application, Ser. No. 283,267, filed Aug. 24, 1972, by Robert C. Minnick et al, entitled "Magnetic Bubble Logic Family", the concept of conservative versus non-conservative bubble logic gates is discussed and all of the possible three input — three output or 3—3 conservative bubble logic gate functions are determined. A substantial portion of the disclosure in the copending application has been published in the Proceedings of the Sept. 19, 1972, Wescon conference in a paper entitled "Magnetic Bubble Logic" by R. C. Minnick et al.

These disclosures describe simple realizations for each of 31 distinct classes of logic functions produced by 3—3 circuits and introduce a special symbology for bubble logic circuits. That symbology as well as the complete list of distinct logic functions and specific realizations is incorporated by reference into this application. The symbology used in the present application is completely consistent with that used in the above disclosures. Accordingly, the avoid undue repetition the development and definition of the symbology and logic circuits already described will be omitted from this application in the interest of emphasizing the specific new circuits contained herein.

Magnetic bubble flip-flop circuits have been described before. For example, circuits using a circulating or "idling" bubble are shown in the following applications: "Propagation of Cylindrical Magnetic Domains in Orthoferrites", Perneski, IEEE Transactions on Magnetics, September 1969, p. 554; "Resident-Bubble Cellular Logic Using Magnetic Domains", Garey, IEEE Transactions on Computers, April 1972, p. 392; "Field-Access Bubble-to-Bubble Logic Operations", Carlson et al, Intermag Conference Proceedings, 1972, and U.S. Pat. No. 3,638,208 to Chow entitled "Magnetic Domain Logic Circuit". U.S. Pat. No. 3,638,208 also discloses a toggle or trigger flip-flop. A magnetic bubble write decoder is shown in "A Self-Contained Magnetic Bubble Domain Memory Chip", Chang, IEEE Transactions on Magnetics, volumn MAG-8, No. 2, June 1972, p. 214.

SUMMARY OF THE INVENTION

The general purpose of the invention is to complement existing bubble logic circuits with special purpose circuits essential to various kinds of data processing subsystems. In particular, reset-set (R-S) and trigger (T) flip-flops are presented based on circuits among the thirty-one classes of 3—3 conservative bubble logic gates. In one embodiment, an R-S flip-flop is constructed from a logic circuit realization identified as a class 9 circuit in the Wescon publication. To provide flip-flop operation, one of the class 9 circuit outputs is connected to an input thereof via a one bit storage loop. The use of other circuits falling into different classes of the 3—3 circuits as described in the Wescon publication is based on their production of outputs which correspond to the logic equation for the R–S flip-flop. An embodiment of a T flip-flop based on a class 9 circuit is also disclosed. Circuits in other circuit classes as described in the Wescon publication useful for T flip-flops are also suggested.

A bubble logic decoder based on a plurality of 3—3 circuits identified as class 21 circuits in the Wescon publication produces all possible product permutations of combinations of a plurality of parallel input variables with the aid of a single bubble generator. A planar two-variable bubble logic decoder based on class 21 circuitry produces all possible permutations of two-variables without any crossovers of bubble tracks.

A planar crosspoint bubble logic circuit based in part on class 21 circuitry accepts two-variables as inputs and produces outputs on opposite tracks representing each of the input variables alone, their product (the AND function) and the inverted product (the NAND function). The term "planar" refers to the absence of crossovers of bubble tracks.

The planar two-variable decoder and planar crosspoint circuits are combined to produce a planar four-variable decoder. The crosspoint circuits are arranged in a matrix with the AND output of each crosspoint circuit forming one of the decomposition products. A pair of two-variable decoders form the horizontal and vertical inputs to the matrix of crosspoint circuits.

BRIEF DESCRIPTION OF THE DRAWINGS

FIG. 4 is a schematic diagram of another four-variable decoder bubble circuit.

DESCRIPTION OF THE PREFERRED EMBODIMENTS

The symbology used in FIGS. 1–6 is based on that described in the Wescon publication and copending application mentioned above. Accordingly, the structure of the bubble circuits shown in these figures will be clear from the illustrated circuit diagrams.

The circuits described in this application are not necessarily restricted to any particular type of MBT device. The word "bubble" used throughout this text is intended to encompass any single-walled magnetic domain, defined as a domain having an outer boundary which closes on itself. The manner of bubble propagation is an important factor in the implementation and performance of the logic circuits described below. However, this disclosure is not limited of necessity to chevron circuit elements or even to field-accessed circuit elements, although it is recognized that it is a decided advantage to utilize individual circuit elements which pack very closely like chevrons. Since the logic capability of MBT is due primarily to bubble-bubble repulsion, in contrast pure memory capabilities which rely solely on the presence and absence of bubbles, the disclosure is limited to schemes in which bubble propagation paths come close enough at some point that bubbles in two or more paths exert a useful magnetic influence on each other.

Generally speaking, the following circuits are non-conservative specializations of conservative 3—3 circuits. A 3—3 circuit is one having three bubble inputs and bubble outputs. Magnetic bubbles may be created with a device termed a generator, destroyed with an annihilator and split into two bubbles on separate tracks with a splitter. A conservative circuit is one in which bubbles are neither destroyed or generated or split and a non-conservative circuit is one in which bubbles are generated or split or destroyed. A generator is symbolized by the numeral 1, an annihilator by a box with an $x$ inside, and a splitter by the letter "S".

Unless otherwise indicated, the circuits described below operate on streams of bubbles where positions along the streams represent bits and the presence or absence of a bubble at a particular bit position in a stream conveys information. Where several streams coact they are synchronized. That is, the bit positions within each stream correspond when they approach a transfer field or other logic device. Moreover, unless otherwise indicated, a bubble generator repeatedly generates bubbles at regular intervals to create a full stream of bubbles similarly synchronized with other bubble tracks where necessary. Bubble compressors can be used to effectively shorten a portion of a bubble track where needed.

Figure 1:
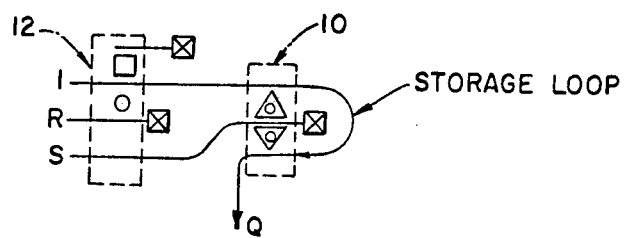
FIG. 1 is a schematic diagram of an R-S flip-flop bubble circuit.

FIG. 1 shows an R-S flip-flop based on a non-conservative specialization of a 3—3 conservative bubble circuit of the type identified in the Wescon publication as a class 9 circuit. The heart of the class 9 circuit is a pair of vertically graded symetrical transfer fields known as strong triangles as indicated generally at 10. Top, middle and bottom tracks traverse the fields 10. In the class 9 conservative circuit realization shown in the Wescon paper, the top, middle and bottom tracks form the inputs on one side and the outputs on the other side of the fields 10, and the input bubble streams proceed in the same direction on all three tracks whereas in FIG. 1 the bubbles proceed in the reverse direction in the bottom track of the circuit 10. The flip-flop of FIG. 1 also employs a specialized circuit 12 of the type identified in the Wescon publication as a class 21 circuit. A bubble generator is connected to the input of the middle track of the circuit 12 and this same track forms the top track for the class 9, circuit 10. The outputs of bottom and top tracks of the class 21, circuit 12 are connected to annihilators. The input of the bottom line of the circuit 12 is the reset input of the flip-flop and is designated R. When a bubble enters the reset input, that is, reset is "true", a corresponding bubble leaving the bottom generator is repelled to the top track of the circuit 12 and is destroyed. Since the generator continues to generate bubbles at the same rate, the reset or "R" bubble knocks a hole in the stream of bubbles on the top track of the circuit 10. The input of the middle track of the circuit 10 is the set input, designated S, and the output of their track is annihilated after passing through the circuit 10. The output of the top track of the circuit 10 connects to the input of the bottom track of the circuit 10 via a storage loop whose effective length is equivalent to one bit period. The bottom track of the circuit 10 after passing the transfer field becomes the output Q of the R-S flip-flop.

In contrast to the input connected to the bubble generator, the R and S inputs of the flip-flop receive single non-repeated bubbles. In operation, assuming an initial state in which th Q is 0, the input to the circuit 10 on the top track will be a stream of bubbles. Because of the strong triangle field, each bubble in the stream is transferred to the middle track of circuit 10 and annihilated. Thus, the flip-flop output remains 0. A set bubble entering on the middle track of the circuit 10 arrives at the same time as one of the bubbles in the generated stream. The set bubble is annihilated, and the corresponding bubble in the generated stream travels through the storage loop and arrives at the transfer field in the bottom track of circuit 10 synchronously with the arrival of the next bubble in the generated stream. Because the two bubbles repel each other, the bubbles on the top and bottom tracks do not change tracks. This operation is sustained by each succeeding bubble so that the output Q is a stream of bubbles representing the set state of the flip-flop, which, it should be noted, was originated by a single set bubble. The arrangement of the bubbles on the top and bottom tracks of the circuit 10 traveling in opposite directions requires precise positioning of the transfer fields 10 at the point at which the oppositely traveling bubbles cross in order to provide sufficient time for the bubbles to magnetically influence each other.

After being placed in the set condition, the flip-flop may reset to 0 by a bubble applied to the reset input R; that is, the output stream Q is stopped, after the R input receives a bubble knocking a hole in the generated stream. The derailment ultimately causes the arrival on the top track on the circuit 10 of a hole, or the absence of a bubble. As a result the preceeding bubble arriving at the bottom track of the circuit 10 simultaneously with the hole on the top track will not be repelled. As a result the bubble on the bottom track will be directed by the strong triangle to the middle track where it is annihilated. In the subsequent bit period the hole arrives on the bottom track of circuit 10 at the same time as the next subsequent bubble arrives at the circuit 10 on the top track. Not being repelled, the bubble on the top track is transferred to the middle track and annihilated. Subsequent bubbles in the generated stream are similarly annihilated. Accordingly, the output has been reset.

When the flip-flop is in the reset state a bubble on the reset line causing a hole in the generated stream has no effect on the output Q. Similarly, when the flip-flop is in the set state an input bubble on the set line has no effect at all on the output. Interestingly, however, when input bubbles occur simultaneously on the reset and set lines the output remains unchanged. This insures that the "invalid" happening of simultaneous set and reset bubbles has no effect on the flip-flop.

Circuits from other classes among the 31 classes of distinct outputs in 3—3 conservative circuits disclosed in the Wescon publication may be used instead of class 9. In order to utilize the appropriate circuit in one of the other classes it may be necessary to interchange the set, reset and generator lines.

The logic equation for the R–S flip-flop provides a guide for selecting appropriate other classes of 3—3 circuits: $Q^{n+1} = R'S + R'Q^n$, where $n+1$ represents the time after $n$, and prime indicates NOT. Thus, circuits producing an output with the format $X(Y+Z)$ as in circuit 9 and others, can be specialized to provide a flip-flop function. In addition, because of the R–S flip-flop constraint, $RS = 0$, the term $RS$ in the flip-flop equation may be reduced to S; and thus circuits having output functions with the format $X + YZ$ will also suffice.

To illustrate with respect to the circuit specifically shown in FIG. 1, let it be assumed that the inputs of the top, middle and bottom tracks respectively are designated $X$, $Y$ and $Z$. The output function on the top track will then be $X(Y+Z)$. To utilize this output, the function $X$ is made to represent "not reset" or $R'$, $Y$ made to represent "set" and $Z$ made to represent the preceding output on the top track, $Q^n$. To accomplish this latter representation a one bit period delay loop connects the top output track with the bottom input track. This technique of circuit design may be extended to other classes in an obvious manner.

Figure 2:
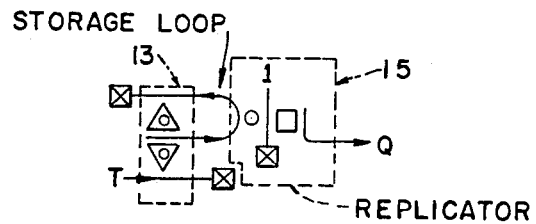
FIG. 2 is a schematic diagram of a T flip-flop bubble circuit.

FIG. 2 shows a trigger flip-flop also based on a specialized class 9 circuit designated by the reference number 13. A single trigger bubble forms the input on the bottom track of the circuit 13. In the initial state when the output is in the reset or 0 condition this bubble is swept via the strong triangle to the middle track where it proceeds around a one bit period storage loop to form the input in the opposite direction on the top track after passing the strong triangle field between the top and middle tracks. The top track is terminated by an annihilator. In the initial state, after triggering by a single bubble, the bubble from the storage loop on the top track is transferred by the preferred strong triangle field to the middle track where it re-enters the storage loop and continues to circulate at the same rate. While in the circulating mode, the flip-flop may be reset by causing a trigger bubble to arrive at the circuit 10 on the bottom track at the same time as the circulating bubble on the top track. As a result, both bubbles will remain on their tracks and be annihilated, thus ending the circulation. The actual output of the circuit is by detection or bubble replication. One form of replicator is shown in FIG. 2 comprising a specialization of a class 21 circuit designated by reference number 15. The generator line forming the middle track for the circuit 12 is annihilated, except when a circulating bubble transfers a corresponding generated bubble via the rectangular field to the output Q. This replication will take place during every bit period. Another way of replicating the circulating bubble is to use a bubble splitter located somewhere on the storage loop.

Other classes besides class 9 will be found to be appropriate for constructing a trigger or T flip-flop from 3—3 circuits. A technique for finding suitable classes among the 31, 3—3 classes described in the Wescon publication derives from the formula for the T flip-flop as follows: $Q^{n+1} = Q^n + T$. For example, the class 9 circuit provides one output which is logically defined as $Y + (X + Z)$, where the inputs are X, Y and Z respectively. By omitting a Y or middle track input as shown in FIG. 2, the T flip-flop results when the Z input represents the trigger bubble and the X input or top track receives the middle track output via the storage loop.

Figure 3:
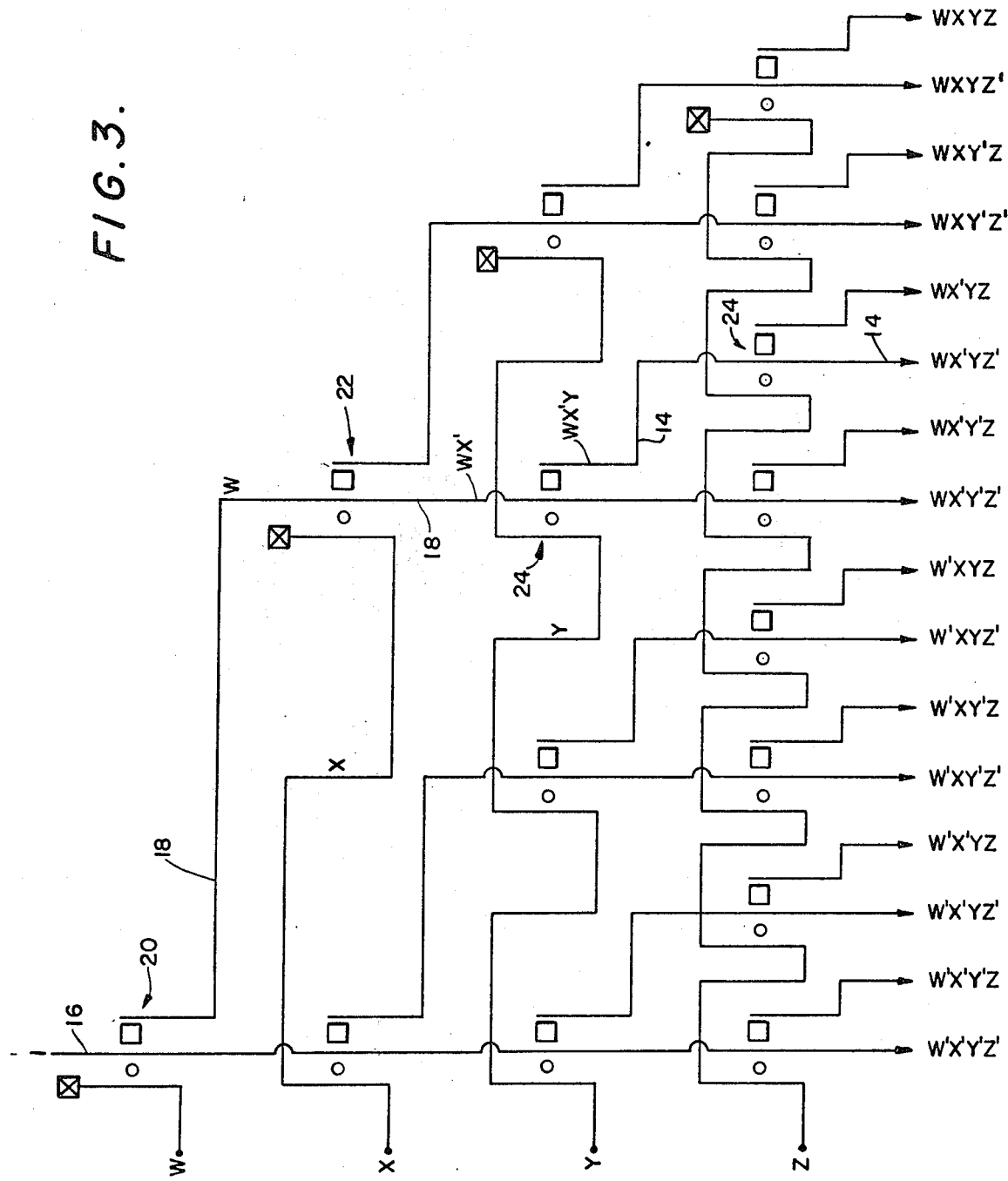
FIG. 3 is a schematic diagram of a four-variable decoder bubble circuit.

FIG. 3 illustrates a four-variable decoder based on a plurality of pyramided circuits identified as class 21 circuits in the Wescon publication. There are four input tracks for bubble data streams. Accordingly, there are sixteen output tracks representing the decomposition products of these four-variables. The logical formula shown at each output of FIG. 3 identifies the decomposition product produced at that output. For example, let it be assumed that the input variables W, X, Y and Z are respectively 1010 for one bit period, ones and zeros corresponding to the presences and absences of bubbles on the respective tracks. Accordingly, the only output among the sixteen outputs which could be "true" is the output WX'YZ' designated 14. The generator bubble on track 16 is switched to the track 18 in the class 21 circuit 20 by virtue of the presence of a bubble applied to the W input. When the displaced generated bubble, which will then represent W, arrives at the next level class 21 circuit 22, it is simultaneously met by the absence of a bubble from the X input since X = 0. As a result, the bubble representing W on track 18 will remain on track 18 through the circuit 22. The bubble after passing through the circuit 22 will represent the product WX'. When the bubble on track 18 reaches circuit 24 in the third level of class 21 circuits, the bubble is met by the presence of a bubble, which was applied to the Y input to represent 1. The bubble applied to the Y input will cause the bubble on track 18 to be displaced to the top track 4 of the circuit 24 where it represents WX'Y. When the bubble on track 26 reaches the circuit 28 in the fourth level of class 21 circuit, it will be met by the absence of a bubble from the Z input since Z = 0. This allows the bubble to remain on track 14 through circuit 28. After passing through circuit 28, it represents the decomposition product WX'YZ'. The remaining 15 outputs of the decoder will not receive a bubble.

Another form of four-variable decoder is shown in FIG. 4. The difference between the circuits of FIGS. 3 and 4 lies in the manner of threading the input variable lines to the various class 21 circuits at each level. In FIG. 4, splitters allow a replicated input bubble on a single line to service two symmetrically oriented class 21 circuits. On the other hand, in the circuit of FIG. 3 the input bubble tracks wind their way through the class 21 circuits of the appropriate level in series.

The techniques shown in the circuits of FIGS. 3 and 4 may be extended to any number of variables. In addition, these circuits can be specialized by allowing one or more of the variables to represent a constant for example by using a generator in place of a variable, or by letting the 1 generator be replaced by a variable.

Figure 5:
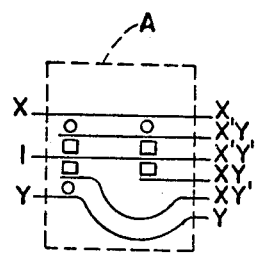
FIG. 5 is a schematic diagram of a planar two-variable decoder bubble circuit.

The circuit of FIG. 5, labeled "A", uses a combination of specialized class 21 circuits to produce permutations of products of two variables X and Y, in addition to the trivial outputs X and Y.

If a bubble is received on the X input and not in the Y input of their circuit, the bubble on the X input will repel the simultaneous bubble from the bubble generator to the track leading to the output labeled XY'. If a bubble is received on the Y input and not on the X input, the generated bubble will be repelled to the track leading to the output labeled X'Y. If bubbles are received both X and Y inputs, the generated bubble will receive equal repulsion from both the X and Y bubbles at the first field and therefore will remain on its track until it reaches the second field where it will be repelled by the X bubble to the track leading to the output labeled XY. If neither an X or a Y bubble is received, the generated bubble will remain on its track to the output labeled X'Y'.

Figure 6:
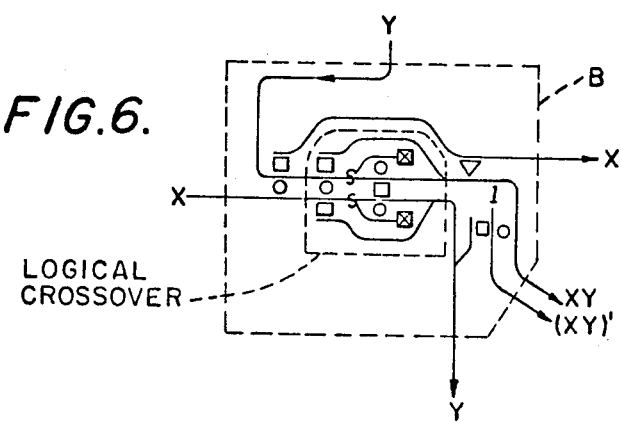
FIG. 6 is a schematic diagram of a planar crosspoint bubble circuit.

FIG. 6 illustrates a planar crosspoint circuit B based primarily on a combination of class 21 circuits except for the use of a weak triangle to produce the output x. The circuit includes a logical crossover also disclosed in the copending application mentioned above. The X variable is applied to the circuit from the left and reproduced at an output on the right as illustrated in FIG. 6. Similarly the Y variable is applied from the top and is reproduced at an output at the bottom. Inverted and non-inverted products (AND and NAND) of the variables X and Y are produced in the lower right hand quadrant between the X and Y output lines. The geometry of this circuit is important as seen, for example, in FIG. 7 where a plurality of crosspoint circuits B are matrixed in a planar array containing no physical crossovers of bubble tracks.

Figure 7:
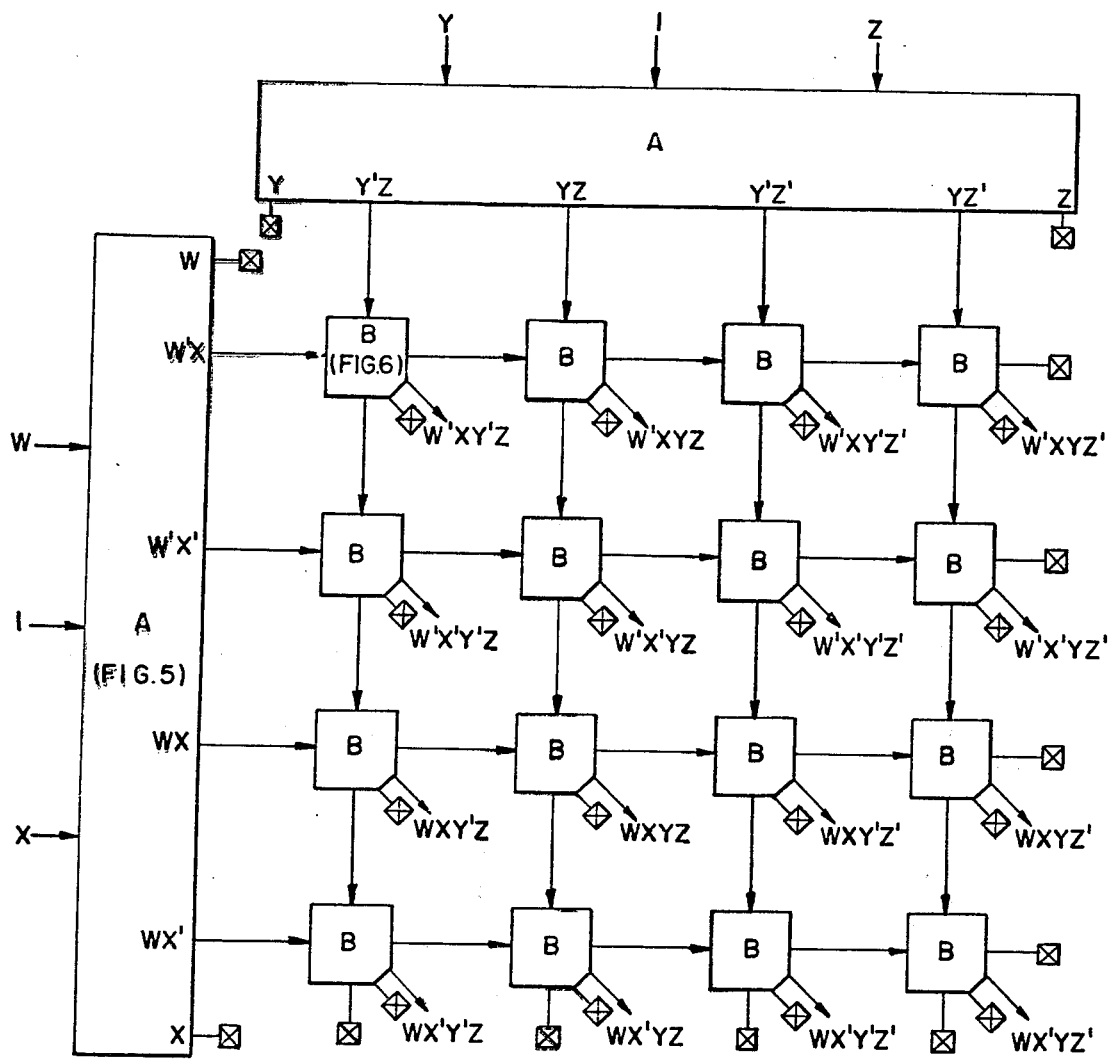
FIG. 7 is a block diagram of a planar four-variable decoder employing the circuits of FIGS. 5 and 6.

The system of FIG. 7 is a planar four-variable decoder containing no internal physical crossovers. Sixteen crosspoint B circuits as shown in detail in FIG. 6 are connected in a matrix. The X output of a first B circuit forms the X input to a second B circuit in the same row. Likewise, the Y output of the first B circuit forms the Y input to a third B circuit in the same column. The remaining connections are made in a similar manner. The NAND outputs of each circuit B are annihilated in FIG. 7 but may be utilized if desired.

Parallel inputs to the X inputs of each B circuit in the first column of the matrix are provided by a planar two-variable decoder A circuit as shown in detail in FIG. 5. The input variables to the first A circuit are W and X. The trivial outputs W and X are annihilated. Another A circuit forms parallel Y inputs to each of the B circuits in the first row of the matrix. This A circuit receives the input variables Y and Z whose trivial outputs are similarly annihilated. All 16 decomposition products of W, X, Y, Z are produced within the matrix by the non-inverted product or AND outputs of the B circuits as indicated by the logical formula shown adjacent to each output.

The invention may be embodied in other specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

We claim:

1. A planar two-variable non-conservative magnetic bubble decoder, comprising a pair of outer magnetic bubble tracks having corresponding input ends for receiving and transmitting magnetic bubbles, a plurality of non-intersecting intermediate bubble tracks arranged between said outer tracks for receiving and transmitting magnetic bubbles, said plurality of intermediate bubble tracks defining four output channels, a control means arranged between adjacent pairs of said outer and intermediate tracks for affecting bubble transfer between said tracks responsive to the combination of presences and absences of bubbles received on said input channels to produce a presence or absence of a bubble on each of said output channels corresponding to a different decomposition product of the input variables associated with said input channels, said variables being represented by the presence or absence of bubbles at said input channels respectively.

2. The circuit of claim 1, wherein said plurality of intermediate tracks includes first, second, third and fourth tracks arranged in that order between said outer bubble tracks, said control means including a bubble generator at the input end of said second track, symmetrical bubble transfer fields between said first and second tracks and said second and fourth tracks at one location, said outer tracks being close enough to said first and fourth tracks at said one location to exert a logical magnetic influence on bubbles in said first, second, and fourth tracks, another pair of bubble transfer fields arranged symmetrically in said first and second tracks and said second and third tracks at another location, one of said outer tracks being close enough to said second track at said second location to exert a logical magnetic influence on bubbles in said first and second tracks.

3. A planar crosspoint magnetic bubble circuit, comprising magnetic bubble logic crossover means for transferring bubbles on first and second input channels to corresponding first and second output channels arranged in reverse order relative to said first and second input channels such that a direct bubble path between said first input and output channels would have to cross a direct bubble path between said second input and output channels, and magnetic bubble logic AND means responsive to bubble bits at said logical crossover input channels for producing a magnetic bubble AND output on a third output channel between said first and second output channels.

4. A planar four-variable magnetic bubble logic decoder circuit, comprising 16 planar crosspoint circuits arranged in the form of a matrix having four rows and four columns, each crosspoint circuit having a pair of orthogonal input channels and a pair of corresponding orthogonal output channels, the orthogonal input and output channels of said crosspoint circuits being interconnected such that a bubble input to one crosspoint circuit is transmitted to subsequent crosspoint circuits in the corresponding row, and the other orthogonal output is transmitted to subsequent crosspoint circuits in the corresponding column, each said crosspoint circuit also producing an output representing the product AND function of the binary variables represented by the orthogonal inputs to that crosspoint circuit, and a pair of two-variable planar decoder circuits each having a corresponding pair of input channels for receiving bubbles whose presences and absences represent corresponding binary variables, one of the two-variable planar decoders producing four parallel magnetic bubble outputs to the column input channels of the four crosspoint circuits in the first row of the matrix, and the other two-variable decoder producing four parallel bubble outputs to the row input channels of the crosspoint circuits in the first column, the outputs of each two-variable decoder representing individually the decomposition products of the input variables to that two-variable decoder.

5. A planar crosspoint bubble logic circuit, comprising a plurality of non-intersecting bubble tracks for transmitting magnetic bubbles providing a pair of input channels and three output channels, first and second ones of said output channels being arranged in reverse order relative to corresponding first and second ones of said input channels such that a direct bubble path between said first input and output channels would have to cross a direct bubble path between said second input and output channels, control means associated with said plurality of bubble tracks responsive to the combination of bubble bits at said input channels to effect crossover of bubble bits on said input channels by reproducing bubble bits on said first input channels at said corresponding first output channel and bubble bits on said second input channel at said corresponding second output channel and for producing a product of bubble bits at said input channels on the third output channel between the other two output channels.

6. The circuit of claim 5, wherein said third output channel is a direct extension of one of said input channels.

7. The circuit of claim 6, further comprising third output channel control means for transferring a bubble flowing along said extension of one of said input channels toward said third output channel to one of said first and second output channels in the absence of a bubble on one of said first and second input channels.

8. The circuit of claim 5, further comprising a fourth output channel adjacent to said third output channel and located between said third output channel and one of said first and second output channels, and control means for producing on said fourth output channel the logical complement of the product produced on said third output channel.

9. The circuit of claim 8, wherein said fourth output channel control means includes means for continuously providing a bubble at the input end of said fourth output channel and means for transferring a bubble thus provided from said fourth output channel to one of said first and second output channels in response to the presence of a bubble on said third output channel.

10. The circuit of claim 5, wherein one of said first and second output channels is a direct extension of one of said first and second input channels.

11. The circuit of claim 10, wherein said second output channel is a direct extension of said first input channel.

12. The circuit of claim 11, wherein said third output channel is a direct extension of said second input channel, said first output channel being provided by a separate bubble channel interconnected with said input channel via said control means.

13. A planar crosspoint bubble logic circuit, comprising a pair of crosspoint input channels and four crosspoint output channels interconnected by a transfer control circuit including first transfer means responsive to the presence of a bubble on a first one of said input channels for transferring a bubble simultaneously present on a second one of said input channels to a first one of said output channels, a crossover circuit having first and second input channels and first and second output channel arranged such that a direct bubble path between said first input and output channels would have to cross a direct bubble path between said second input and output channels including means for reproducing a bubble bit on said first input channel at said first output channel and a bubble bit on said second input channel at said second output channel, means for connecting said first crosspoint input channel to said first input channel of said crossover circuit and means for connecting said second crosspoint input channel via said first transfer means to said second input channel of said crossover circuit, second transfer means downstream from said first transfer means for transferring a bubble on said first output channel of said crosspoint circuit to said first crosspoint output channel in the absence of a bubble simultaneously present on said first crosspoint output channel, means for connecting the first output channel of said crossover circuit directly to a second crosspoint output channel representing the product of the bubble bits on said first and second crosspoint input channels, bubble generator means for providing a continuous sequence of bubbles to a third one of said crosspoint output channels, third transfer means downstream from said second transfer means responsive to the presence of a bubble on said second crosspoint output channel for transferring one of the bubbles provided by said generator means from said third crosspoint output channel to the second output channel of said crossover circuit, and means for connecting said second output channel of said crossover circuit via said third transfer means to the fourth crosspoint output channel.

* * * * *